(12) United States Patent
Haywood et al.

(10) Patent No.: US 9,323,712 B2
(45) Date of Patent: Apr. 26, 2016

(54) HYBRID MEMORY BLADE

(71) Applicant: INPHI CORPORATION, Santa Clara, CA (US)

(72) Inventors: Christopher Haywood, Thousand Oaks, CA (US); Chao Xu, Thousand Oaks, CA (US); Fouad G. Tamer, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/878,680

(22) Filed: Oct. 8, 2015

(65) Prior Publication Data
US 2016/0026601 A1   Jan. 28, 2016

Related U.S. Application Data

(63) Continuation of application No. 14/576,008, filed on Dec. 18, 2014, now Pat. No. 9,185,823, which is a continuation of application No. 13/768,986, filed on Feb. 15, 2013, now Pat. No. 8,949,473.

(60) Provisional application No. 61/599,835, filed on Feb. 16, 2012, provisional application No. 61/602,494, filed on Feb. 23, 2012.

(51) Int. Cl.
| | |
|---|---|
| *G06F 3/00* | (2006.01) |
| *G06F 13/00* | (2006.01) |
| *G06F 13/42* | (2006.01) |
| *H05K 7/14* | (2006.01) |
| *H05K 7/20* | (2006.01) |

(52) U.S. Cl.
CPC .......... *G06F 13/4282* (2013.01); *H05K 7/1487* (2013.01); *H05K 7/1489* (2013.01); *H05K 7/1491* (2013.01); *H05K 7/1492* (2013.01); *H05K 7/20836* (2013.01)

(58) Field of Classification Search
None
See application file for complete search history.

(56) References Cited

U.S. PATENT DOCUMENTS

| | | |
|---|---|---|
| 5,592,612 A | 1/1997 | Birk |
| 6,128,094 A | 10/2000 | Smith |
| 6,400,621 B2 | 6/2002 | Hidaka et al. |
| 6,542,956 B1 | 4/2003 | Lee et al. |
| 6,993,701 B2 | 1/2006 | Corbett et al. |
| 7,656,727 B2 | 2/2010 | Thayer |
| 7,990,746 B2 | 8/2011 | Rajan |
| 8,325,554 B2 | 12/2012 | Sweere et al. |
| 8,687,451 B2 | 4/2014 | Wang |

(Continued)

OTHER PUBLICATIONS

Office Action for U.S. Appl. No. 13/653,373, dated Mar. 27, 2014.

(Continued)

*Primary Examiner* — Michael Sun
(74) *Attorney, Agent, or Firm* — Richard T. Ogawa; Ogawa P.C.

(57) ABSTRACT

The present invention is directed to server systems and methods thereof. More specifically, embodiments of the present invention provides a memory controller within a server system, where the memory controller is disengageably connected to one or more processors, a plurality of volatile memory modules, and plurality of solid-state memory modules. This memory controller may be connected to other similarly configured memory controllers. The volatile and solid-state memory modules can be removed and/or replaced. There are other embodiments as well.

20 Claims, 15 Drawing Sheets

(56) References Cited

U.S. PATENT DOCUMENTS

| | | | |
|---|---|---|---|
| 8,930,647 B1* | 1/2015 | Smith | G06F 9/44557 711/103 |
| 2004/0123029 A1 | 6/2004 | Dalal et al. | |
| 2005/0010709 A1* | 1/2005 | Davies | G06F 11/1456 710/305 |
| 2006/0200697 A1 | 9/2006 | Ito | |
| 2008/0104290 A1 | 5/2008 | Cowell et al. | |
| 2008/0183959 A1 | 7/2008 | Pelley et al. | |
| 2009/0141558 A1 | 6/2009 | Sarin et al. | |
| 2009/0300259 A1 | 12/2009 | Luo et al. | |
| 2010/0005212 A1 | 1/2010 | Gower et al. | |
| 2010/0162037 A1 | 6/2010 | Maule et al. | |
| 2010/0199125 A1 | 8/2010 | Reche | |
| 2010/0274952 A1 | 10/2010 | Lee | |
| 2011/0072200 A1 | 3/2011 | Lee et al. | |
| 2011/0125990 A1 | 5/2011 | Khosravi et al. | |
| 2011/0170329 A1 | 7/2011 | Kang | |
| 2012/0047548 A1* | 2/2012 | Rowlands | H04N 21/21815 725/142 |
| 2012/0151294 A1 | 6/2012 | Yoo et al. | |
| 2012/0243299 A1 | 9/2012 | Shau | |
| 2012/0257459 A1 | 10/2012 | Berke | |
| 2012/0297231 A1 | 11/2012 | Qawami et al. | |
| 2013/0060996 A1 | 3/2013 | Berke | |

OTHER PUBLICATIONS

Notice of Allowance for U.S. Appl. No. 13/558,332, dated Feb. 25, 2014.
Office Action for U.S. Appl. No. 13/620,288, dated Oct. 1, 2013.
Office Action for U.S. Appl. No. 13/791,814, dated May 1, 2014.
Office Action for U.S. Appl. No. 13/619,692, dated May 14, 2014.
Office Action for U.S. Appl. No. 13/620,288, dated May 16, 2014.
Office Action for U.S. Appl. No. 13/791,807, dated May 29, 2014.
Office Action for U.S. Appl. No. 14/178,241, dated Jun. 27, 2014.

* cited by examiner

HYBRID MEMORY BLADE

CROSS-REFERENCES TO RELATED APPLICATIONS

The present application is a continuation of and claims priority to U.S. patent application Ser. No. 14/576,008, filed on Dec. 18, 2014, which is a continuation of and claims priority to U.S. patent application Ser. No. 13/768,986, filed on Feb. 15, 2013, which claims priority to U.S. Provisional Patent Application No. 61/599,835, filed Feb. 16, 2012, titled "Hybrid Memory Blade" and U.S. Provisional Patent Application No. 61/602,494, filed Feb. 23, 2012, titled "iMC and the Memory Appliance," all of which are incorporated by reference herein.

BACKGROUND OF THE INVENTION

The present invention is directed to server systems and methods thereof.

Since the invention of the first generation of microcomputers in the 1970s, architectures and housing of computer system have been continually evolving. Computer systems that are used as servers are typically mounted on racks. In contrast, personal computers, or mini computers, are typically mounted within computer cases.

For server application, a certain level of modularity is needed, where additional computing resources can be added, removed, replaced, and/or modified. For example, the VME-bus architecture in the 1980s defined a computer interface which included implementation of a board-level computer installed in a chassis backplane with multiple slots for pluggable boards to provide I/O, memory, or additional computing. The PCI Industrial Computer Manufacturers Group (PICMG) developed a chassis/blade structure for the then emerging Peripheral Component Interconnect (PCI) bus. Common among these chassis based computers was the fact that the entire chassis was a single system.

The term "blade server" has a card included the processor, memory, I/O and non-volatile program storage. The blade server configuration allowed manufacturers to package a complete server, with its operating system and applications, on a single card/board/blade. These blades could then operate independently within a common chassis, doing the work of multiple separate server boxes more efficiently. In addition to the most obvious benefit of this packaging (less space-consumption), additional efficiency benefits have become clear in power, cooling, management, and networking due to the pooling or sharing of common infrastructure to supports the entire chassis, rather than providing each of these on a per server box basis.

Unfortunately, conventional blade system have been inadequate for various reasons, as explained below. It is desirable to have new and improved blade systems and methods thereof.

BRIEF SUMMARY OF THE INVENTION

The present invention is directed to server systems and methods thereof. More specifically, embodiments of the present invention provides a memory controller within a server system, where the memory controller is disengageably connected to one or more processors, a plurality of volatile memory modules, and plurality of solid-state memory modules. This memory controller may be connected to other similarly configured memory controllers. The volatile and solid-state memory modules can be removed and/or replaced. There are other embodiments as well.

DETAILED DESCRIPTION OF THE INVENTION

Figure 1:
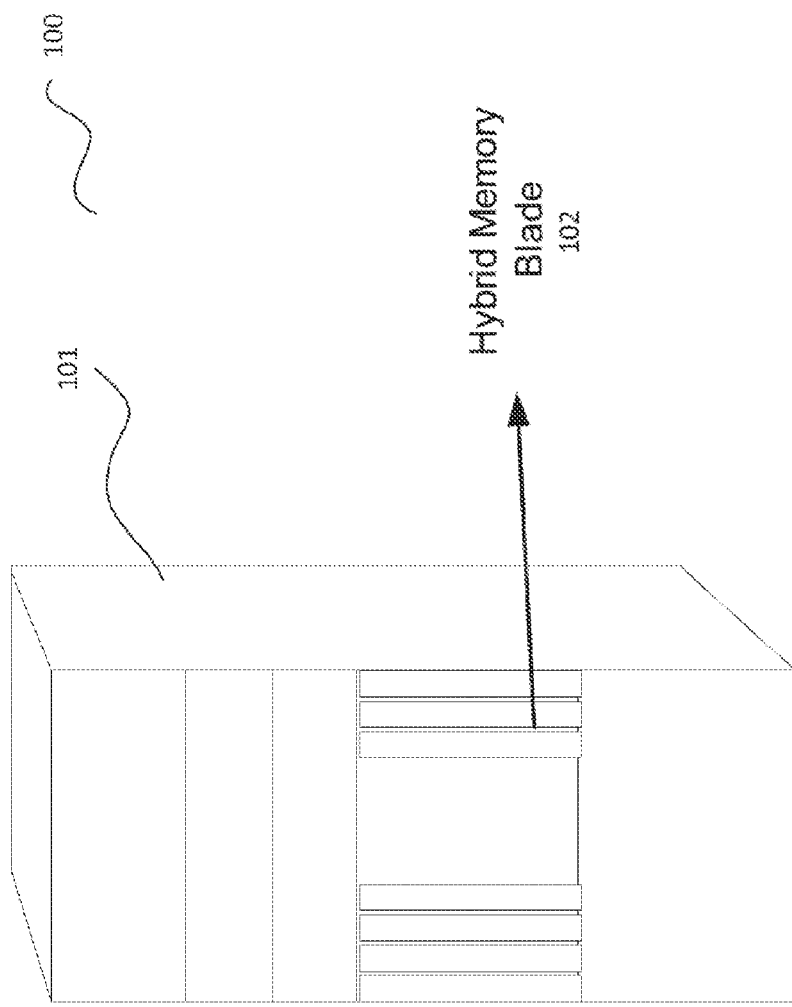
FIG. 1 is a simplified diagram illustrating a hybrid memory blade server according to an embodiment of the present invention.

The present invention is directed to server systems and methods thereof. More specifically, embodiments of the present invention provides a memory controller within a server system, where the memory controller is disengageably connected to one or more processors, a plurality of volatile memory modules, and plurality of solid-state memory modules. This memory controller may be connected to other similarly configured memory controllers. The volatile and solid-state memory modules can be removed and/or replaced. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

The term "blade server" (or sometimes referred to as "blade") usually refers to a stripped-down server computer with a module design optimized to minimize the use of physical space and energy. Whereas a standard rack-mount server can function with (at least) a power cord and network cable, blade servers have many components removed to save space, minimize power consumption and other considerations, while still having all the functional components to be considered a computer. A blade enclosure, which can hold multiple blade servers, provides services such as power, cooling, networking, various interconnects and management. Together, blades and the blade enclosure form a blade. Different blade providers have differing principles regarding what to include in the blade itself, and in the blade system altogether.

A conventional blade server includes a processor, memory, storage, and network interface. The processor and memory needs to be compatible, both in physical connection and communication protocol, with each for the blade server to work. Thus, replacing the processor, as often done when server upgrade is needed, means that new memory modules that are compatible with the new processes replace the old memory modules. It is to be appreciated that with fast-evolving networking applications, it is often unnecessary to replace both processor and memory. For example, moving from a Sandy Bridge processor an Ivy Bridge processor means the memory modules that were used for Sandy Bridge processor is not compatible with the new Ivy Bridge processor, but these memory modules are perfectly usable performance-wise. Embodiments of the present invention offers an integrated memory controller (IMC) that, among other things, provides an interface between the processor and the memory module, thereby allowing otherwise incompatible processor and memory modules to work with each other.

In various embodiments, the present invention provides a hybrid memory blade. For example, the term hybrid memory blade (or simply "blade") refers to a modular design optimized for the scalable high-performance memory/storage needs of present and future servers. A memory blade according to embodiments of the present invention is configured to conform to the form factors used with standard blade servers, and can thus be optimized to minimize the use of physical space and energy. A hybrid memory blade can provide durable and available hybrid memory/storage with high throughput and low access latency. It is to be appreciated that combination of large scale, high performance, and small form-factor characteristics of memory blade according to implementations of the present invention enable a new breed of data-intensive applications.

FIG. 1 is a simplified diagram illustrating a hybrid memory blade server according to embodiments of the present invention. This diagram is merely an example, which should not unduly limit the scope of the claims. One of ordinary skill in the art would recognize many variations, alternatives, and modifications. As shown, a blade server system 100 comprises an enclosure 101. Hybrid memory blade 102 is mounted to the enclosure 101. For example, the enclosure 101 has a blade server rack that can hold the different blades to perform different functions in a computing and storage system. The hybrid memory blade is designed to be compatible with the form factor and mounting interface of the enclosure 101. For example, the hybrid memory blade 102 is mounted to the enclosure 101 via a high-speed data communication interface, through which the blade 102 is capable of receiving from and sending data to processors and/or other blades. For example, the blade 102 is one of many hybrid memory blades mounted on the blade server system 100. It is to be appreciated that the enclosure 101 is configured to accommodate other components as well.

In various embodiments, the blade server system 100 further comprising power supply, thermal management, network interface, storage, and/or other components mounted on or in the enclosure 101. The power supply of the server system 100 may include power supply units that convert AC power to DC power, as needed by the blade computers. In addition, the power supply may have built-in backup and redundancies to ensure proper operation of the blade computers or integrated memory modules. The thermal management system is provided to, among other things, cool the blade computers and other components. For example, blade computer generate a large amount of heat that needs to be dissipated during operation, and fans and/or liquid cooling systems can be used to cool the temperature. The blade computers of the blade server system 100 are connected to network interfaces of the system 100. Among other things, blades may need to communicate with one another, and often there is a need to connect to systems and network outside the blade server system 100.

For blade computers, or computers in general, volatile memory or random access memory (RAM) are used for quick access, and referred to as memory. For example, DRAM, SRAM, SDRAM, and other types of volatile memory are commonly used for quick access, and are commonly referred to as "memories". In contrast, solid-state memory (or sometimes referred to as flash memory) and hard disks are typically referred to as storage, as they are slower than RAM and thus are more suitable for data storage than random access. It is to be appreciated that in various embodiments, both volatile (e.g., RAM) and solid-state memories are used for operation. A "hybrid blade memory" according to embodiments of the present invention is referred to as a 'hybrid' in that it contains at least two different types of memory storage devices, which are controlled by a common memory controller. For example, a hybrid blade may include both DRAM and FLASH memory devices, both controlled by a common hybrid memory controller. A hybrid blade may include one hybrid memory controller or multiple hybrid memory controllers, each of which would typically interface with a subset of the memory devices on board.

Figure 2:
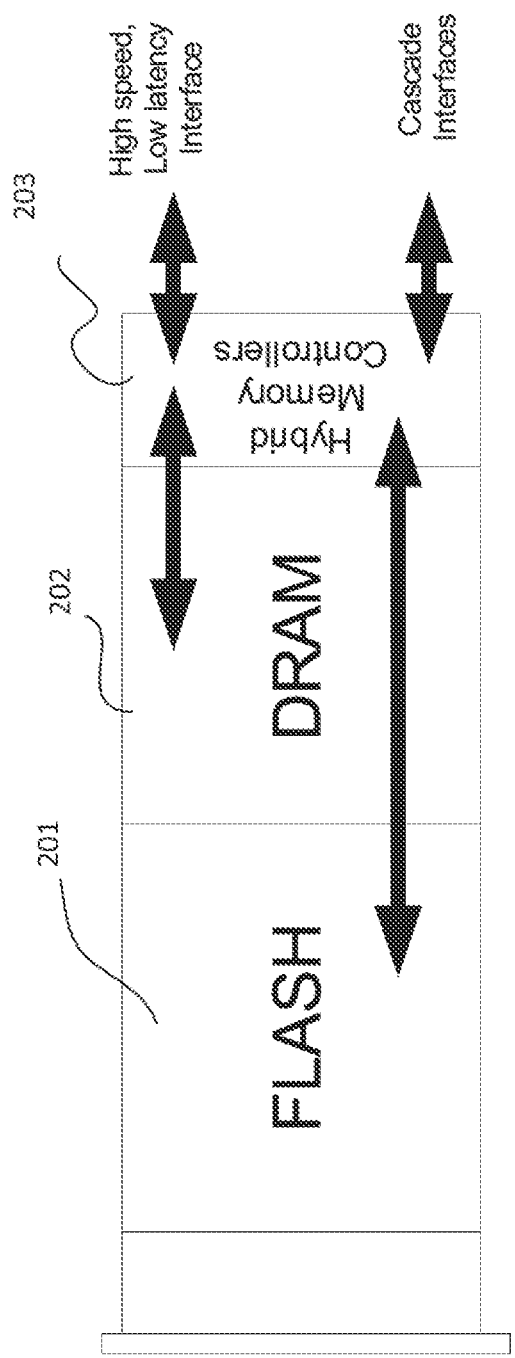
FIG. 2 is a simplified diagram illustrating a hybrid memory controller according to an embodiment of the invention.

FIG. 2 is a simplified diagram illustrating a hybrid memory blade 200 according to an embodiment of the invention. This diagram is merely an example, which should not unduly limit the scope of the claims. One of ordinary skill in the art would recognize many variations, alternatives, and modifications. In various implementations, the hybrid memory controller 203 is arranged to optimize the use of the different memory_ types. For example, the memory blade 200 comprises flash memory 201 which is used to store slowly changing database information, and DRAM 202 into which FLASH data would be loaded for fast access. The blade may also be arranged such that FLASH data is accessed directly, without first being transferred to DRAM. It is to be appreciated that the use of FLASH memory 201 is advantageous in that it provides a much high data storage density that does DRAM, thereby enabling a given system to employ fewer servers. On the other hand, read and write operations to FLASH memory 2012 are much slower than that of DRAM 202. The hybrid memory controller 203 is configured to coordinate the use of the FLASH memory 201 and DRAM 202 to provide the fastest possible data rate. In various embodiments, implementing blade memory is differently than a conventional memory system, where data is stored rather than, for example, files, and with a high speed, low latency interface rather than a conventional I/O structure which can act as a bottleneck to the flow of data. The hybrid memory controller operates with software, which can be customized as needed to optimize the memory blade operation for particular applications and/or for particular memory device types.

As shown in FIG. 2, the hybrid memory controller 203 is coupled to both the DRAM 202 and the FLASH memory 201. It is to be appreciated that FIG. 2 is a simplified block diagram, where there can be a number of flash memory and DRAM modules. Between the DRAM 202 and the controller 203, a high speed and low latency interface is provided. As described below, the controller 203 may also include one or more 'cascade' interfaces, through which it can be coupled to other hybrid memory controllers on the same blade, or coupled to hybrid memory controllers on other blades.

Components of the memory blade 200 can be fitted into a single memory blade housing. In various embodiments, the memory blade 200 complies with form factor of a standard blade server (e.g., c-class server size). For example, a standard 42U server enclosure can fit up to 128 blade server or 128 memory blades. The DRAM 202, for example, can be fitted to ranks of DRAM slots of the memory blade 200 housing. Similarly, flash memory 201 may include a number of modules that are fitted into pre-assigned slots on the memory blade 200 housing.

It is to be appreciated that hybrid memory blades according to embodiments of the present invention are used to expand the computing system memory and storage capacity through high speed, low latency interfaces. For example, the term "memory blade" refers to a blade server as shown in FIG. 2 where a hybrid memory controller is connected to DRAM and flash memory modules, and is further connected to processor and/or other blade servers. Depending on the application, a memory blade according can provide data individually, or together as an aggregated device. For example, aggregation can be accomplished via the chassis, through other blades or top rack switches, or through a "hybrid memory aggregation blade". A hybrid memory aggregation blade can provide an increased parallelism and a reduced latency.

Figure 3:
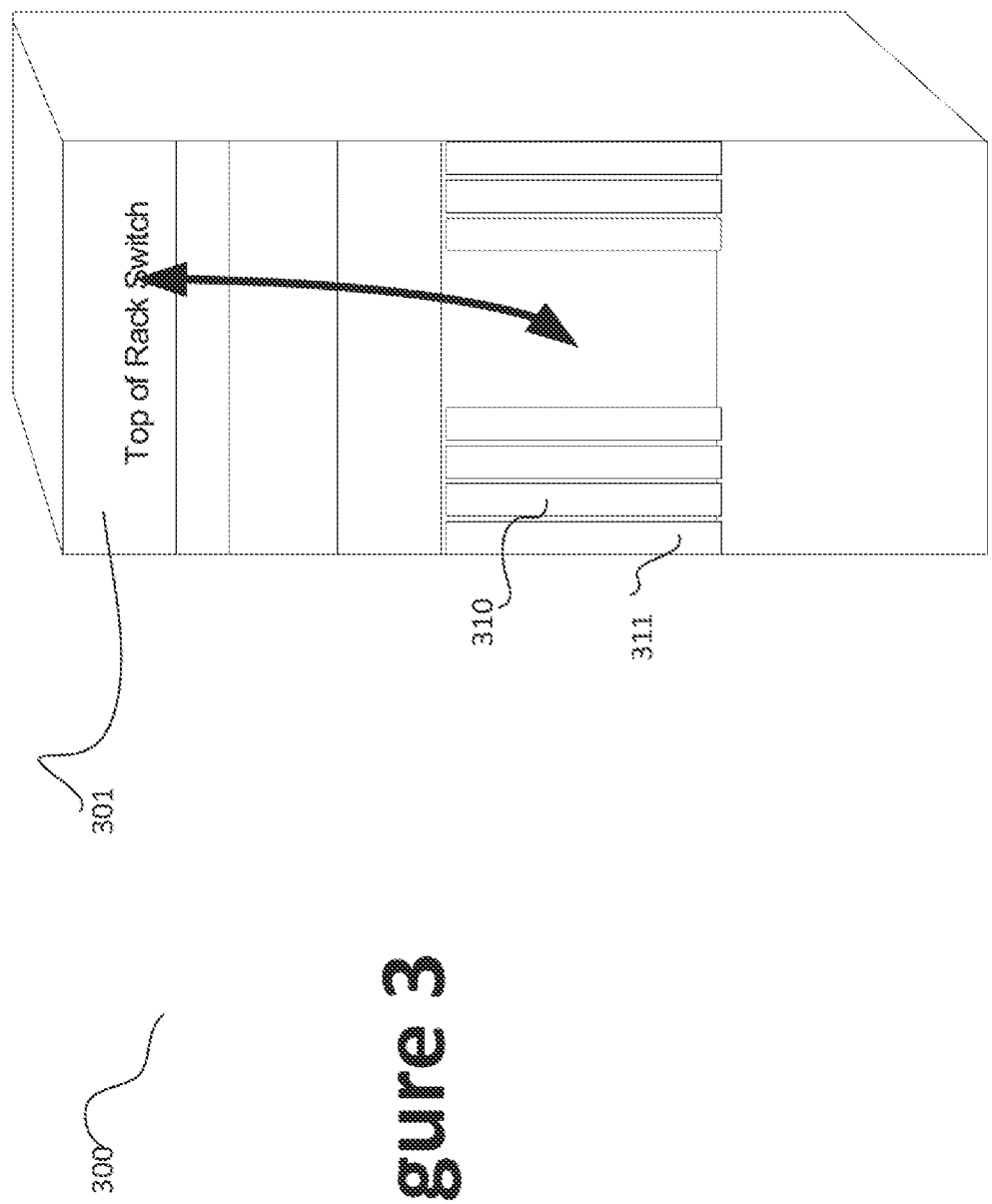
FIG. 3 is a simplified diagram illustrating interconnects of memory blades via a rack switch according to an embodiment of the invention.

FIG. 3 is a simplified diagram illustrating interconnects of memory blades via a rack switch according to an embodiment of the invention. This diagram is merely an example, which should not unduly limit the scope of the claims. One of ordinary skill in the art would recognize many variations, alternatives, and modifications. For example, a blade server system 300 includes a top of rack switch 301 and a number of memory blades, including blade 310 and blade 311. As an example, multiple hybrid memory blades (e.g., blades 310 and 311) are interconnected, via a top of rack switch 301 as shown in FIG. 3. For example, blade 310 and blade 311 are memory blades that are configured on standard blade housings, and can be quickly mounted onto the blade server system 300.

Figure 4:
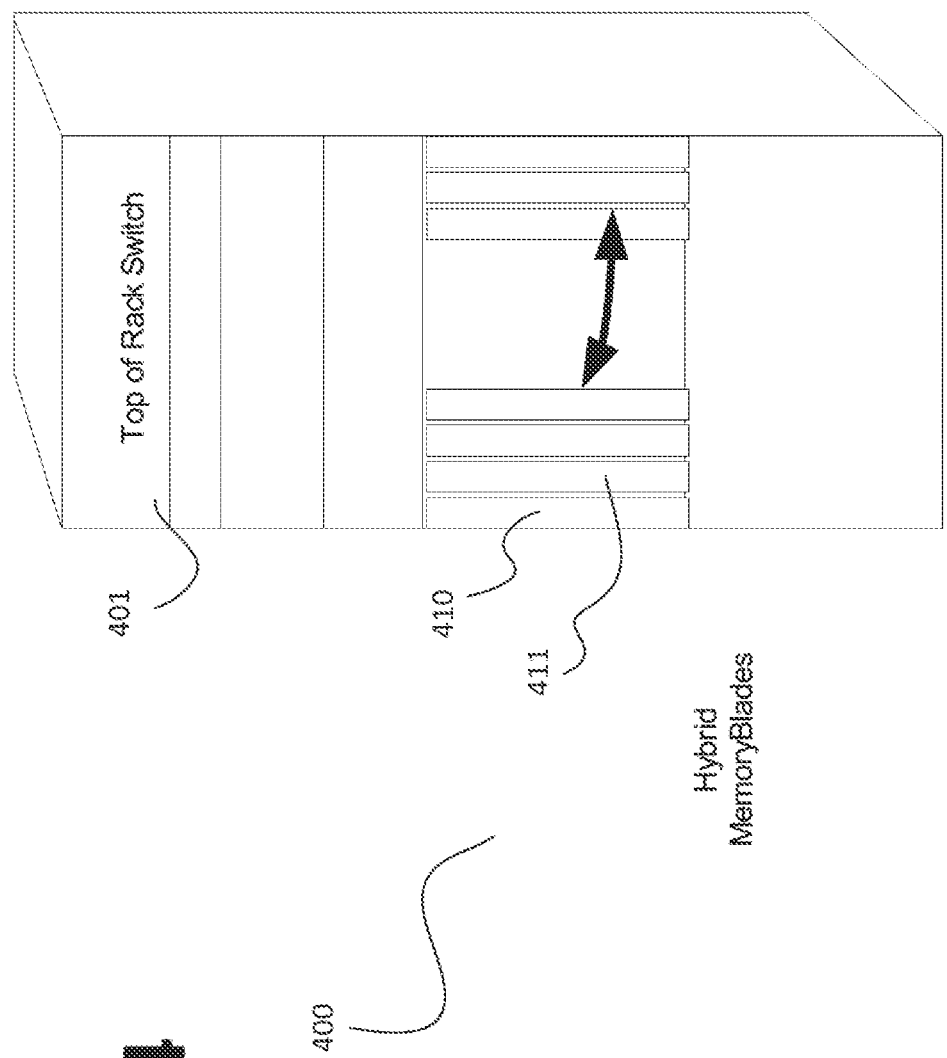
FIG. 4 is a simplified diagram illustrating interconnects of memory blades via cascade interfaces according to an embodiment of the invention.

FIG. 4 is a simplified diagram illustrating interconnects of memory blades via cascade interfaces according to an embodiment of the invention. This diagram is merely an example, which should not unduly limit the scope of the claims. One of ordinary skill in the art would recognize many variations, alternatives, and modifications. For example, a blade server system 400 includes a top of rack switch 401 and a number of memory blades, including blade 410 and blade 411. The blades 410 and 411 are connected to each via their cascade interfaces, which can be a part of their respective memory controller; they are not connected to each other through the top of rack switch 401.

Figure 5:
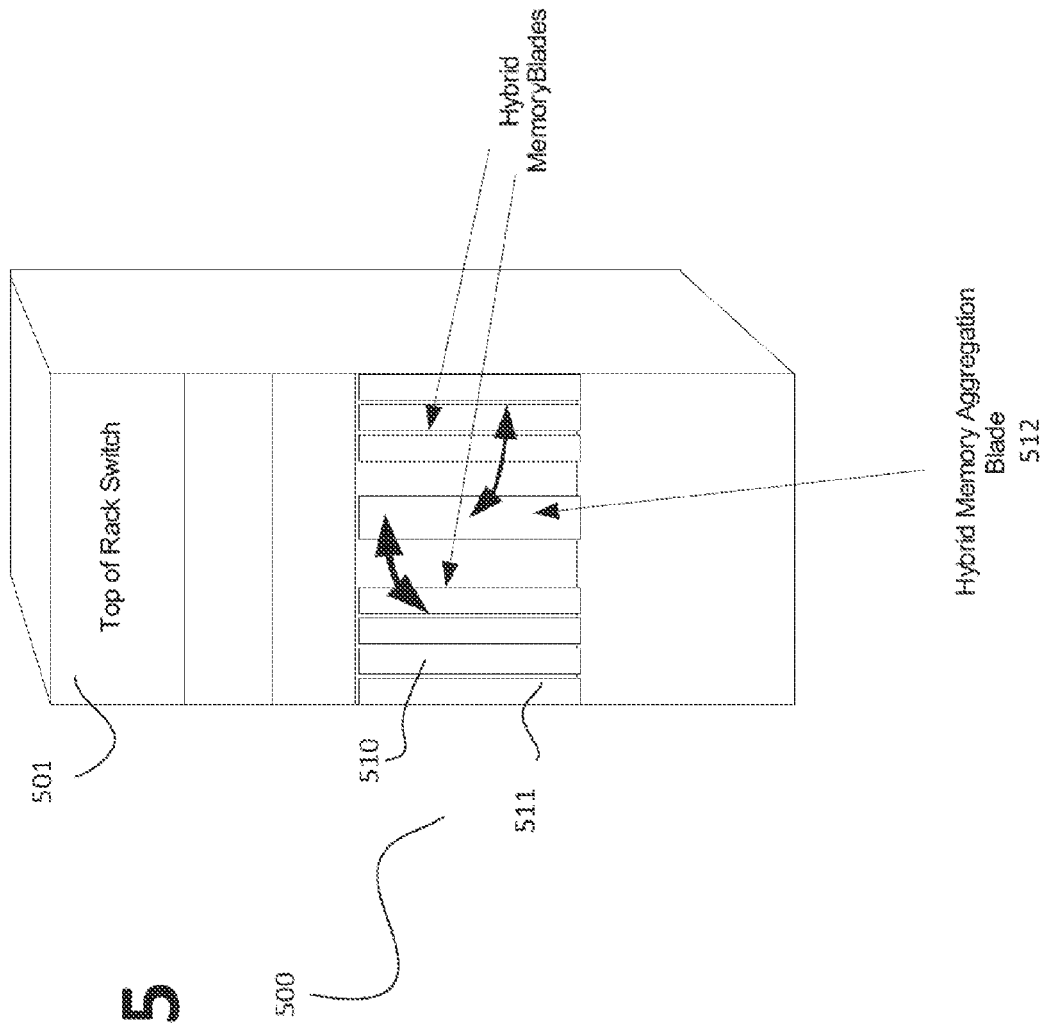
FIG. 5 is a simplified diagram illustrating interconnects of memory blades via an aggregation blade according to an embodiment of the invention.

FIG. 5 is a simplified diagram illustrating interconnects of memory blades via an aggregation blade according to an embodiment of the invention. This diagram is merely an example, which should not unduly limit the scope of the claims. One of ordinary skill in the art would recognize many variations, alternatives, and modifications. In FIG. 5, the blade server system 500 includes a top of rack switch 501, an aggregation blade 512, and a number of memory blades, including blade 510 and blade 511. The blades 510 and 511 are connected to each through the memory aggregation blade 512. For example, the memory aggregation blade 512 comprises a plurality of high speed interfaces that can facilitate the exchange of data among the blades.

It is to be appreciated that data communication among the blades can be accomplished via various type of interconnect and/or interfaces. For example, the blades may be connected to one another via wire, fiber optic cables, and/or others.

Figure 6:
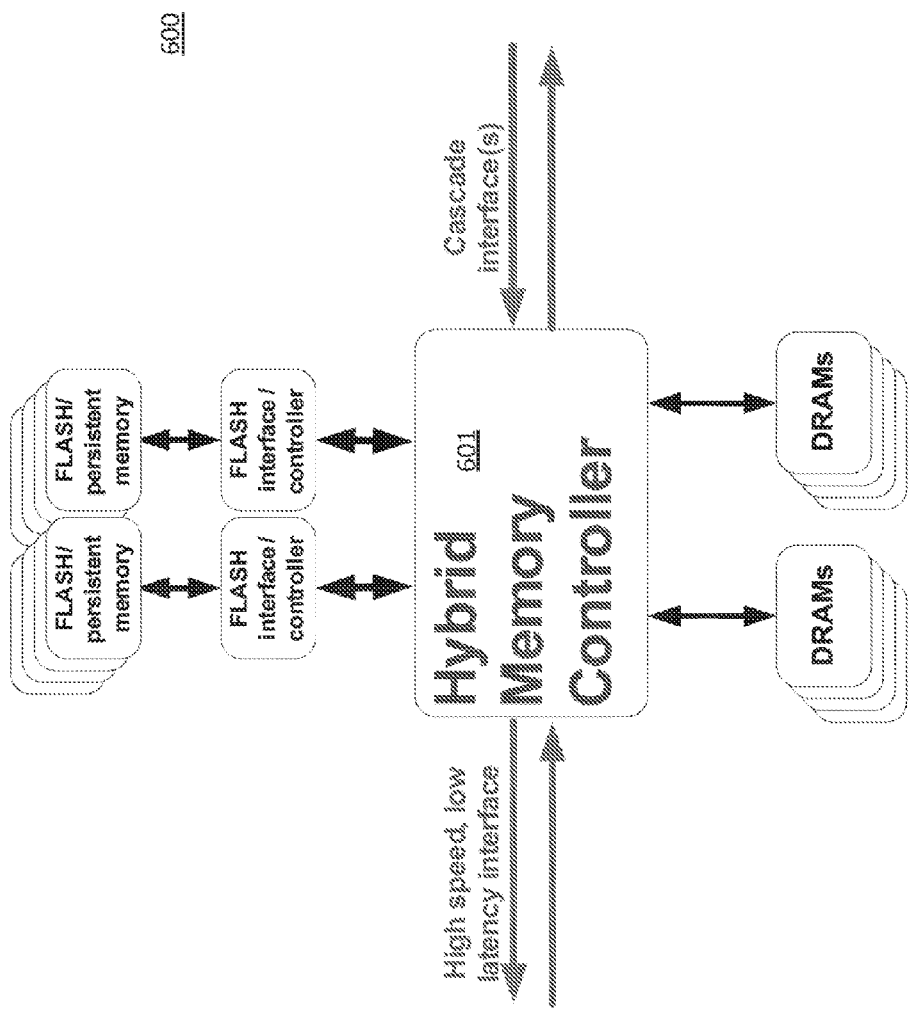
FIG. 6 is a simplified block diagram illustrating a memory blade according to an embodiment of the invention.

FIG. 6 is a simplified block diagram illustrating a memory blade according to an embodiment of the invention. This diagram is merely an example, which should not unduly limit the scope of the claims. One of ordinary skill in the art would recognize many variations, alternatives, and modifications. As shown in FIG. 6, the hybrid memory blade 600 includes a hybrid memory controller 601 and DRAMs and non-volatile memory (e.g., FLASH devices). For example, the flash memory (or other types of solid-state memory) modules is connected to the hybrid memory controller via flash interface/ controllers. It is to be appreciated that by combining high speed, low latency DRAM and cost effective, non-volatile FLASH memory, a memory blade according to embodiments of the present invention creates a hybrid memory/storage system to optimize server system performance, cost, power, and modularity.

A high speed, low latency interface is used to connect the hybrid memory controller 601 of the memory blade 600 to one or more processors or CPU(s). A cascade interface is used to allow daisy-chain connection to one or more distributed hybrid memory controllers. For example, the hybrid memory controller 601 may be connected to another hybrid memory controller of the memory blade 600 or another memory blade. In an embodiment, the hybrid memory controller 601 also includes a DRAM memory controller (not shown) and FLASH interface/controllers. As described above, the hybrid memory controller may include intelligent functions to optimize hybrid memory/storage performance. For example, logic functions of the hybrid memory controller may include selecting between DRAM and/or flash memory for various applications, backing up data stored in DRAM into flash memory, and others.

It is to be appreciated that the hybrid memory blade 600 comprises a plurality of high-speed connections. For example, the high-speed interface that connects to processor can be PCI Express, Hyper Transport (HT) interface, QPI interface, optical connection, and/or others. The hybrid memory controller 601 may connected to DRAM through various types of memory buses, such as DDR3, DDR4, and/or others. Similarly, cascade interface(s) may be 10G KR, 100G high speed interfaces, optical connection, high speed serial connection, and/or others.

Figure 7:
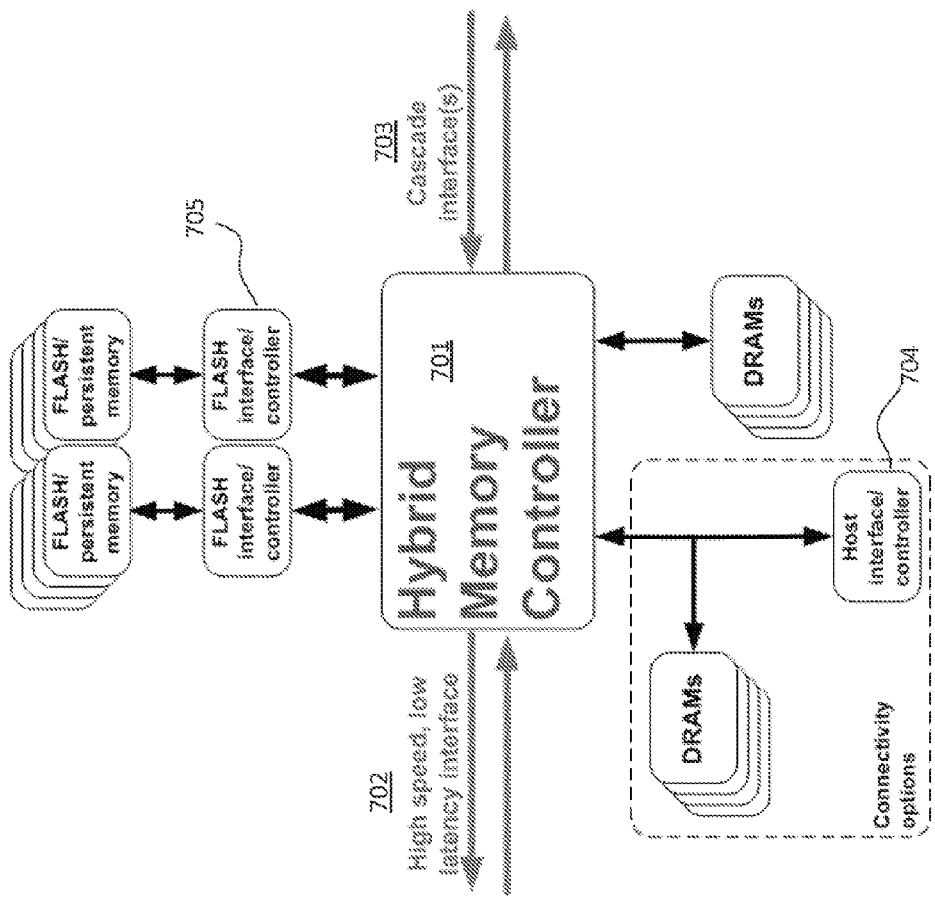
FIG. 7 is a simplified diagram illustrating a memory blade according to an embodiment of the present invention.

FIG. 7 is a simplified diagram illustrating a memory blade according to an embodiment of the present invention. This diagram is merely an example, which should not unduly limit the scope of the claims. One of ordinary skill in the art would recognize many variations, alternatives, and modifications. As shown in FIG. 7, a memory blade 700 comprises a hybrid memory controller 701. The hybrid memory controller 701 has several difference interfaces. For example, the controller 701 can be connected to DRAM directly or via a host interface/controller 704. In a specific embodiment, the connection between the controller 701 and DRAMs are DDRx interfaces. The connection between the hybrid memory controller 701 and the host interface/controller 704 can be DDRx interface, high speed serial interface, and/or others.

The hybrid memory controller 701 also includes interface 702, which is a high-speed, low-latency interface. For example, interface 702 provides a connection to one or more processors. In an embodiment, the interface 702 comprises a high speed serial of connection. The interface 702 may also include optical interface that is capable of high bandwidth (e.g., greater than 100 Gbps). The interface 703 of the hybrid memory controller 701 provides a cascade connection to other hybrid memory controller(s). For example, through the interface 703, the hybrid memory controller 701 may be connected to another hybrid memory controller of the same memory blade 700, or other memory blades. For example, the hybrid memory controller 701 can be referred to as integrated memory controller (iMC). The hybrid memory controller 701 is connected through flash memory through flash interface/controller. For example, the connections to FLASH could be via controller (e.g. SSD) 705 as shown, or through non-SSD controller, and/or locally attached.

Figure 8:
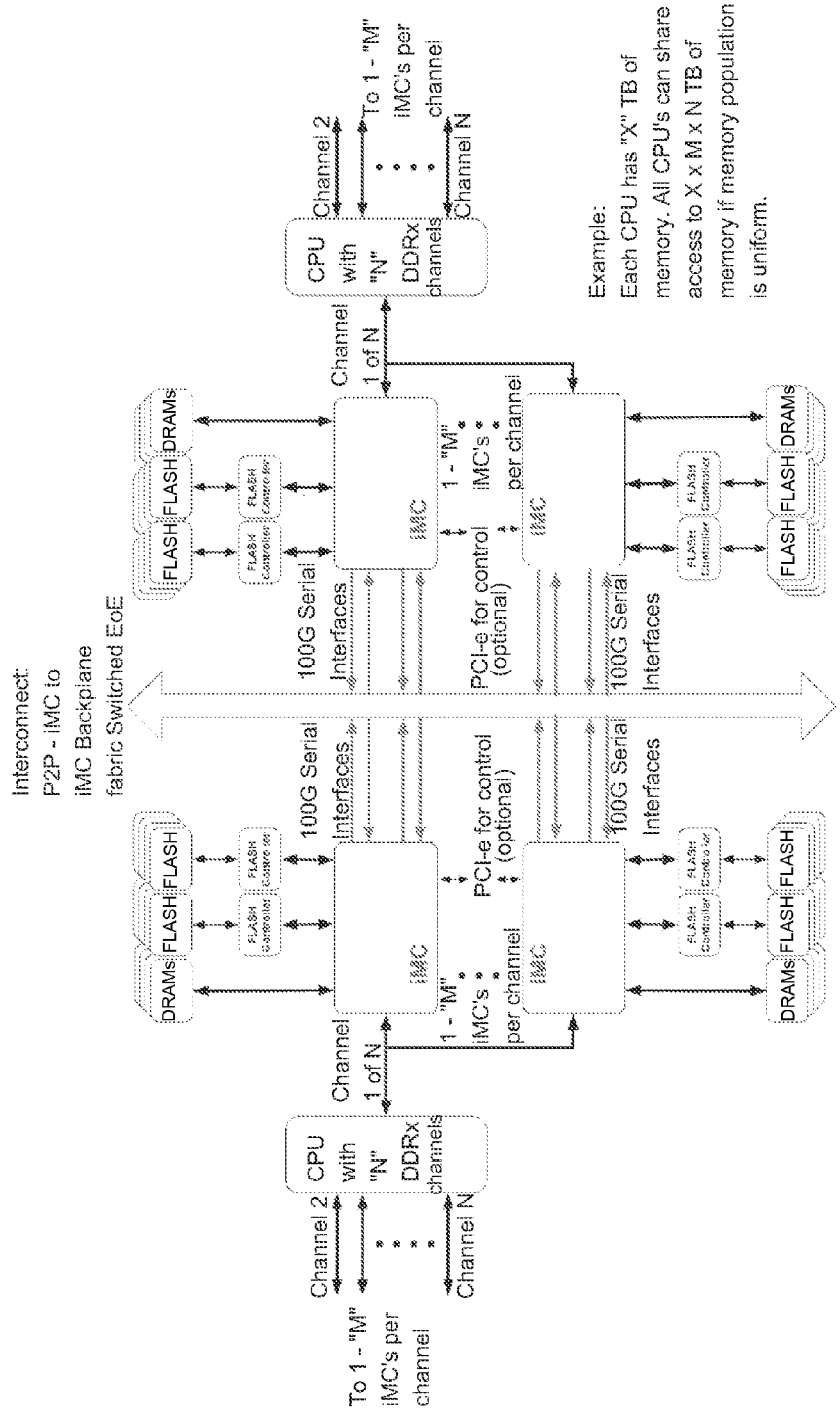
FIG. 8 is a simplified diagram illustrating interconnection among memory blades according to embodiments of the present invention.

FIG. 8 is a simplified diagram illustrating interconnection among memory blades according to embodiments of the present invention. This diagram is merely an example, which should not unduly limit the scope of the claims. One of ordinary skill in the art would recognize many variations, alternatives, and modifications. The integrate memory controllers (iMC) are interconnected using many point to point connections. For example, a host can use iMC via DDR3/4 interface as host access point to memory array. There can be "N" access points per CPU complex to allow connection to N−1 others. As an example, dual processors with 8 iMCs on each processor can access 15 others. As an example, an iMC can be an implementation of a hybrid memory controller.

In various embodiments, each of the iMC assigns addresses to DRAM and/or flash memory. For example, the host address range for each iMC can be limited to 32 GB per rank and up to 8 ranks for a total of 256 GB. In an implementation, if there are 2 iMCs per channel and 4 channels, then 2 TB is available to each CPU through 8 access iMCs. Depending on the application, memory can be allocated statically or dynamically, as required by an appliance manager running on the system. It is to be appreciated that dynamic allocation of memory allows for transfer of variable size blocks of data between CPU's by remapping the transfer area into another CPU's memory space.

In certain embodiments, the blade memory system operates in a hidden DMA mode. For example, memory modules are allocated with read and write transfer buffers. A host would command each iMC to move data between its local buffers to remote iMCs transfer buffers. When transfer is complete, receptor buffer arrival is notified to local processor for data processing, and transmitter buffer departure is notified to reclaim memory or re-use data (e.g. multi-cast operation). There can be other operation modes as well.

Figure 9:
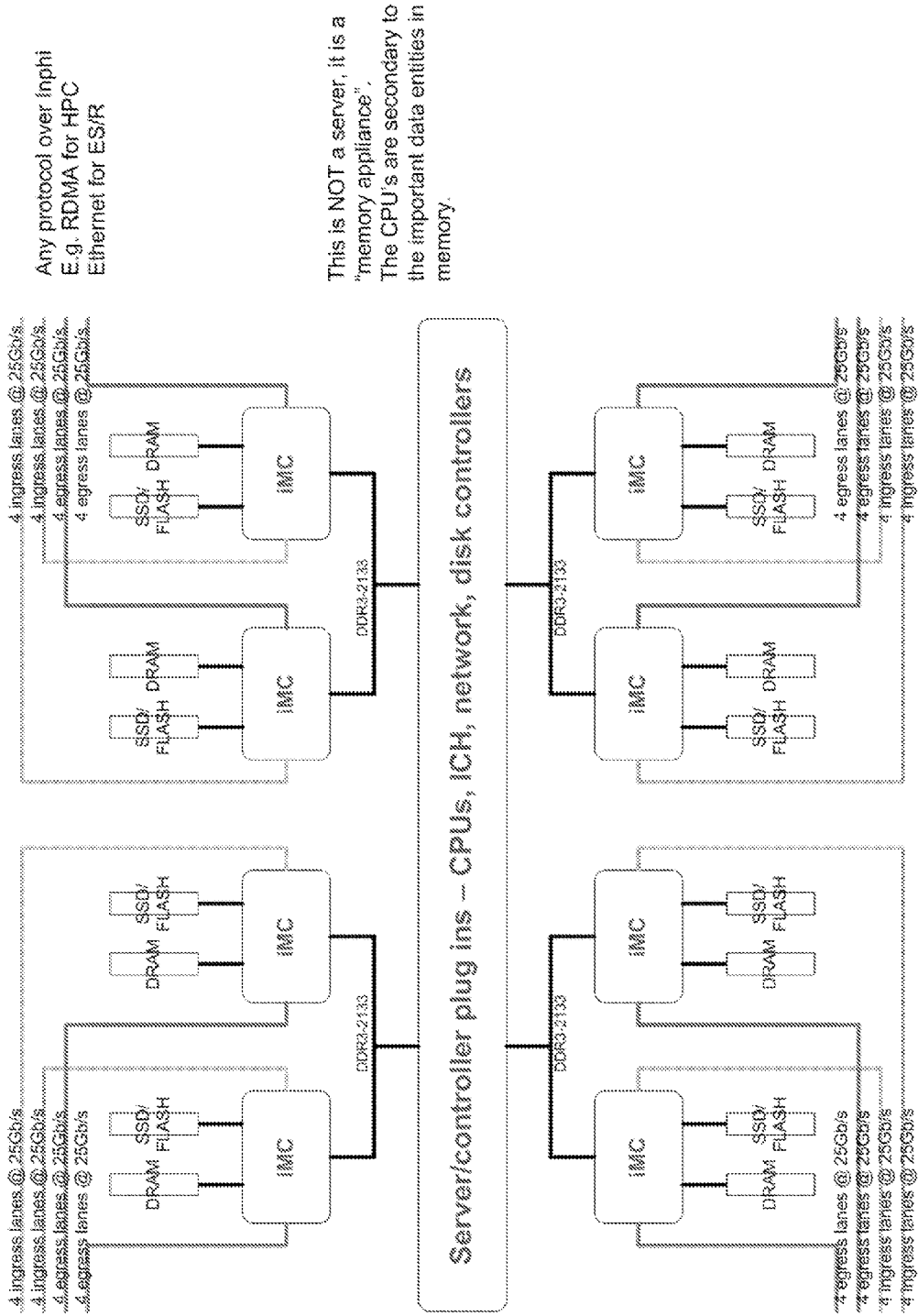
FIG. 9 is a simplified diagram illustrating operation of iMC supporting a processing plug-in module according to embodiments of the invention.

FIG. 9 is a simplified diagram illustrating operation of iMC supporting a processing plug-in module according to embodiments of the invention. This diagram is merely an example, which should not unduly limit the scope of the claims. One of ordinary skill in the art would recognize many variations, alternatives, and modifications. In FIG. 9, multiple iMCs are configured to support a processing plug-in module. For example, the plug-in module can be compute, network, IO, HBA, and/or others. The connection between iMCs is abstracted. For example, the connection can be configured local to a module, local within a rack, inter rack, and/or networked. Data transported is transparent to iMC devices. For example, an iMC delivers buffers from "A" to "B". Encapsulated protocol is contained as the data content provided and interpreted by software running on the processors. Various protocols are supported.

Figure 10:
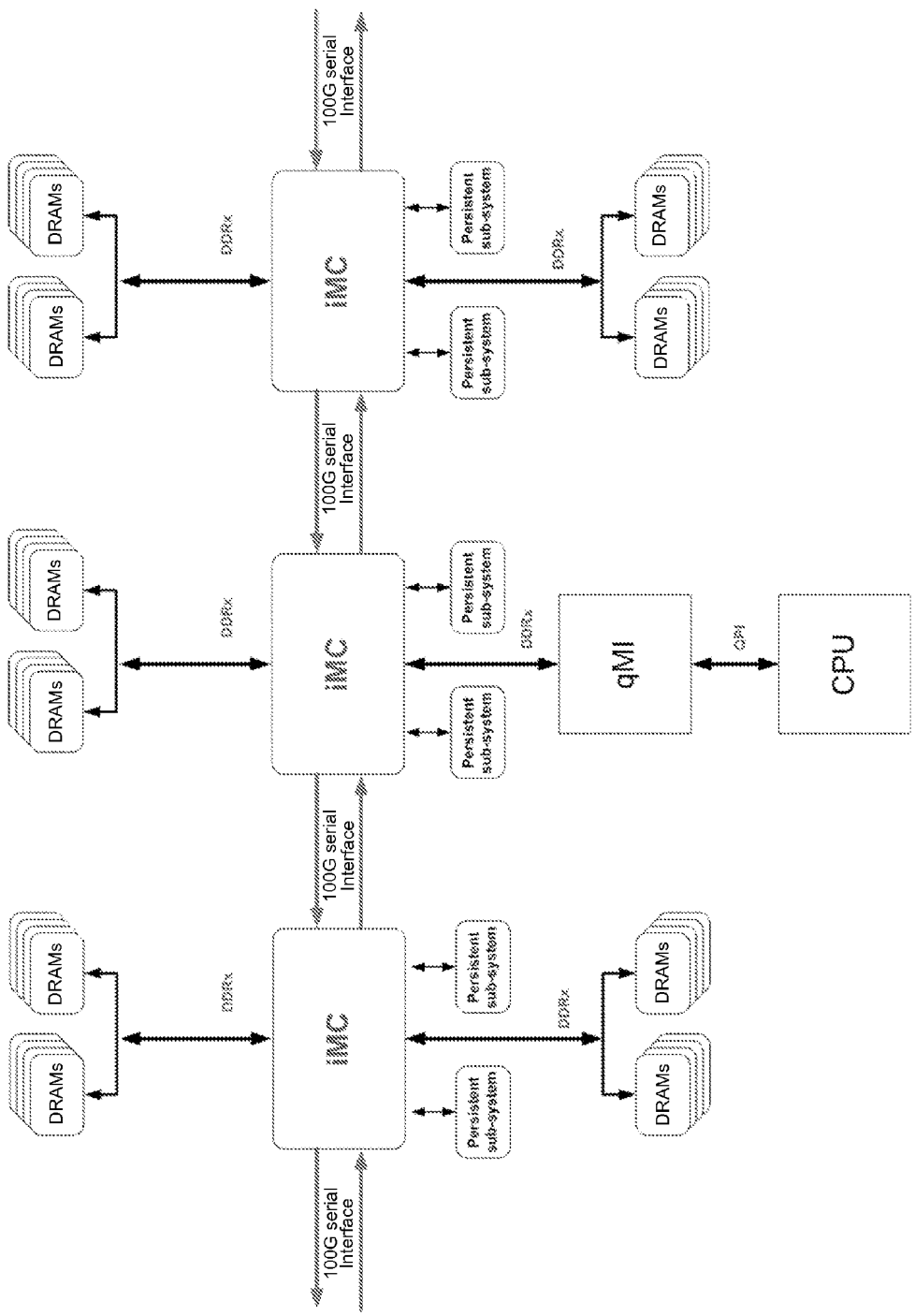
FIG. 10 is a simplified diagram illustrating connection from iMCs to other apparatus according to embodiments of the invention.

FIG. 10 is a simplified diagram illustrating connection from iMCs to other apparatus according to embodiments of the invention. This diagram is merely an example, which should not unduly limit the scope of the claims. One of ordinary skill in the art would recognize many variations, alternatives, and modifications. As shown, host access point could be via a bridge to a proprietary CPU interface. For example, QPI interface is provided for Intel processors, and HT interface is provided for AMD processors. Other protocols (e.g., for connecting to ARM processor, GPU, etc.) can be used as well. In addition, iMC (or hybrid memory controllers) can be connected to persistent storage. The interface between persistent storage and the iMC can be industry standard, such as SATA, proprietary interface to FLASH controller such as iFM, which can be configured as simple pin multiplexor with some local control. In certain implementations, iMCs are directly connected to storage. Depending on the application, iMCs can have multiple DRAM interfaces and multiple persistent memory interfaces. The connections among iMCs may use many types of topology, such as toroid, cube, x-connected cube, and/or others.

Figure 11:
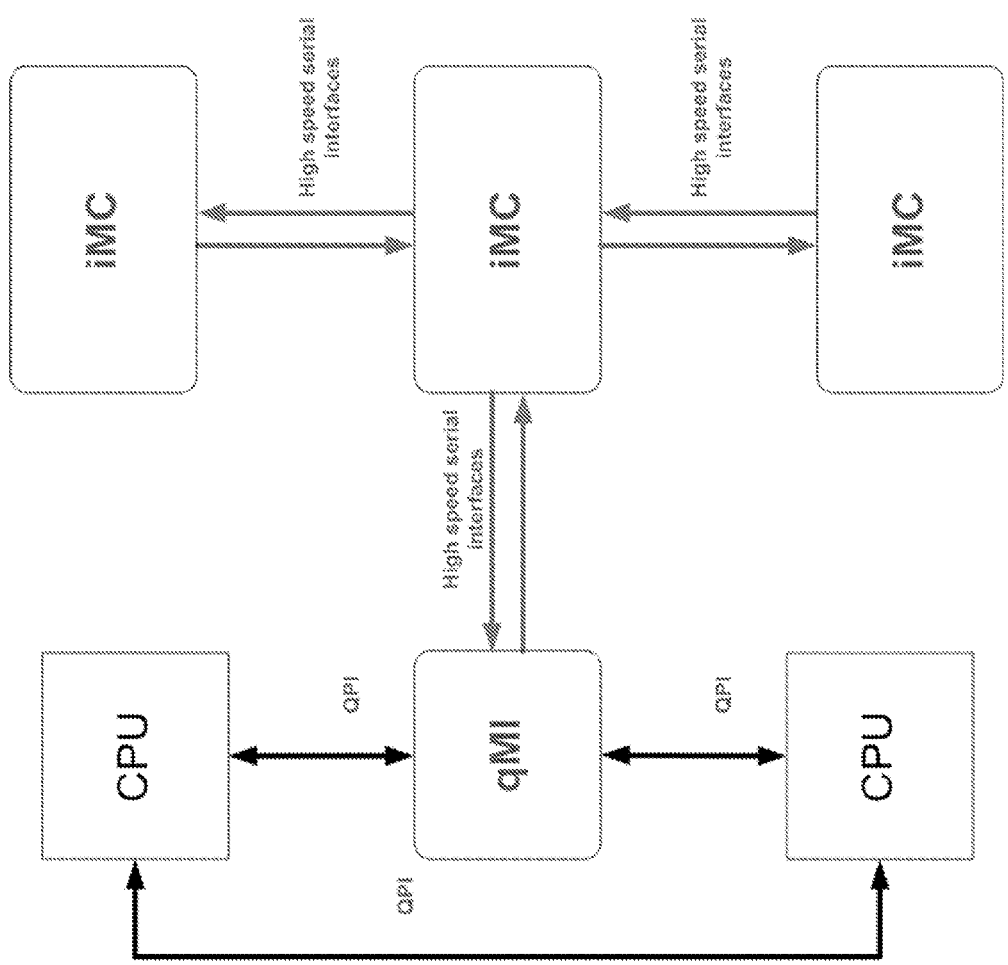
FIG. 11 is a simplified diagram illustrating a memory appliance with QPI interface according to embodiments of the present invention.

FIG. 11 is a simplified diagram illustrating a memory appliance with QPI interface according to embodiments of the present invention. This diagram is merely an example, which should not unduly limit the scope of the claims. One of ordinary skill in the art would recognize many variations, alternatives, and modifications. For example, as shown in FIG. 11, an iMC is connected to a qMI interface through a high-speed serial interface. The qMI is connected to CPUs via QIP interfaces. iMCs that are not directly connected to the qMI can be connected to the qMI through other iMCs. For example, iMCs are connected to one another via high speed serial interfaces.

Figure 12:
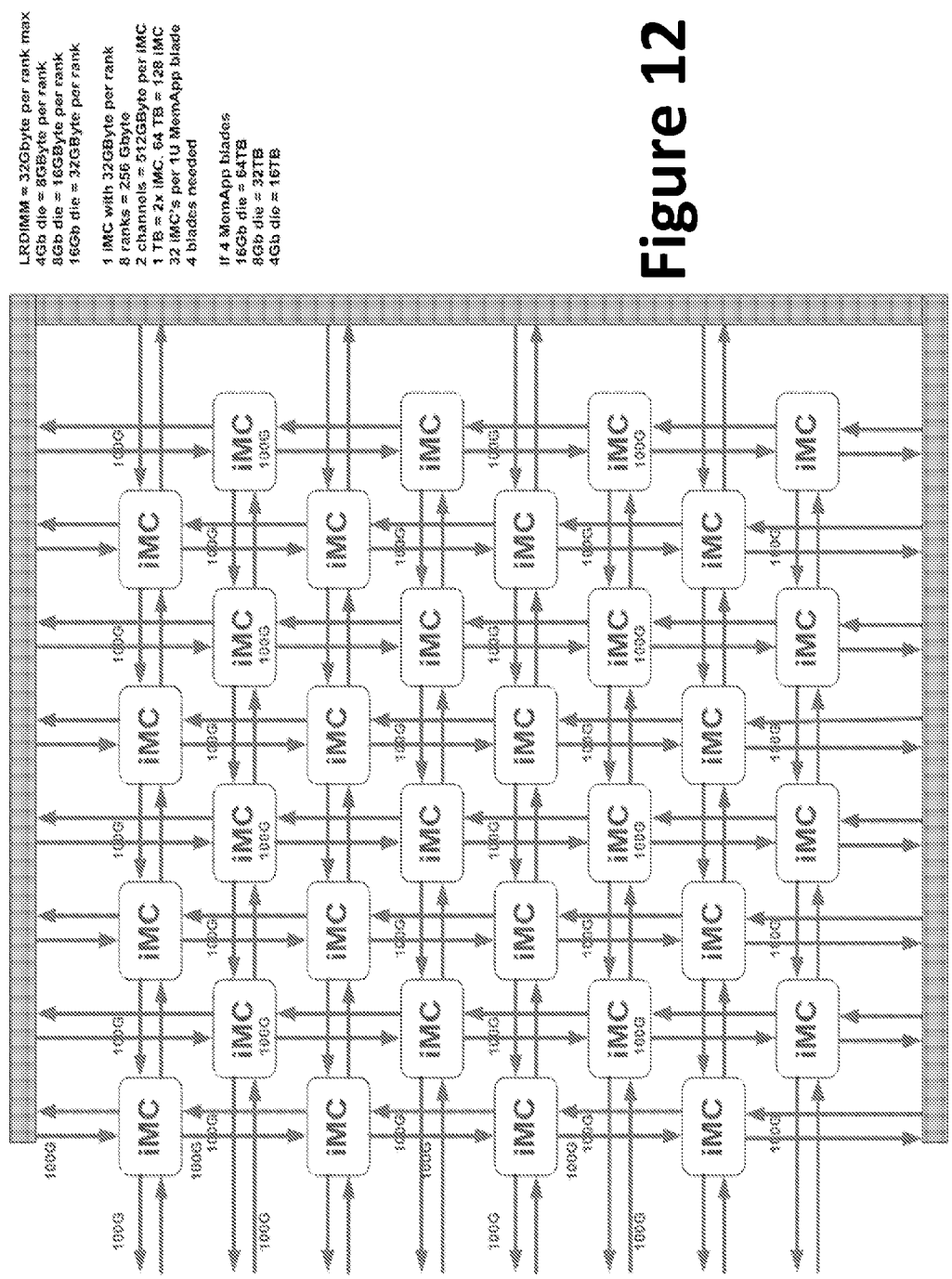
FIG. 12 is a simplified diagram illustrating a cross connection configuration for the iMCs according to embodiments of the present invention.

FIG. 12 is a simplified diagram illustrating a cross connection configuration for the iMCs according to embodiments of the present invention. This diagram is merely an example, which should not unduly limit the scope of the claims. One of ordinary skill in the art would recognize many variations, alternatives, and modifications. For example, the network iMCs as shown in FIG. 12 allows a large amount of data to be shared among iMCs. FIG. 12 shows 100G connections among iMCs, but it is to be appreciated that other connection types and/or bandwidths are possible as well.

Figure 13:
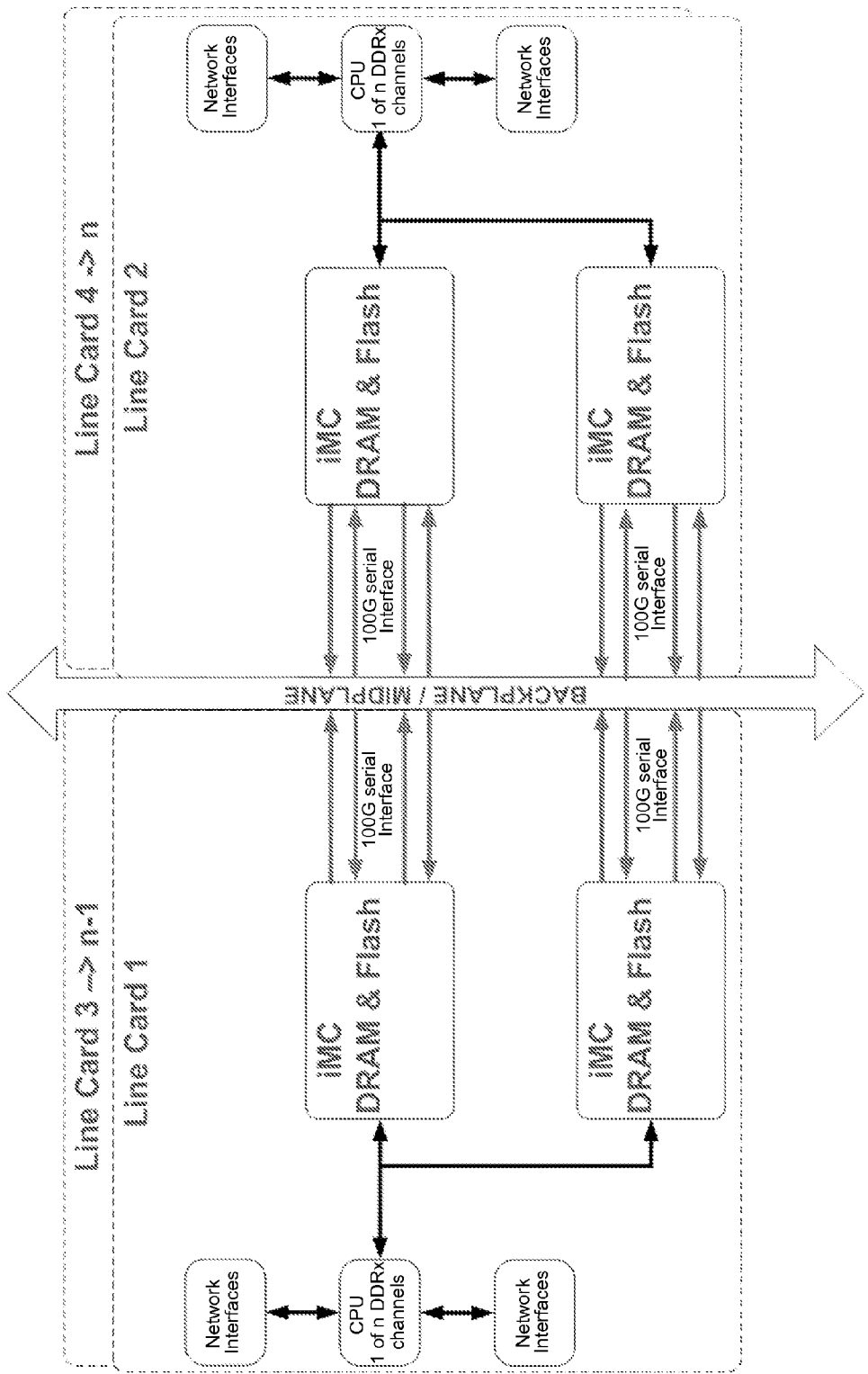
FIG. 13 is a simplified diagram illustrating iMCs with line card configuration according to embodiments of the present invention.

FIG. 13 is a simplified diagram illustrating iMCs with line card configuration according to embodiments of the present invention. This diagram is merely an example, which should not unduly limit the scope of the claims. One of ordinary skill in the art would recognize many variations, alternatives, and modifications. As shown, iMC are CPUs are part of a line card, and each line card can have multiple iMCs and network interfaces. For example, line cards can be connected to one another via a backplane/midplane bus.

Figure 14:
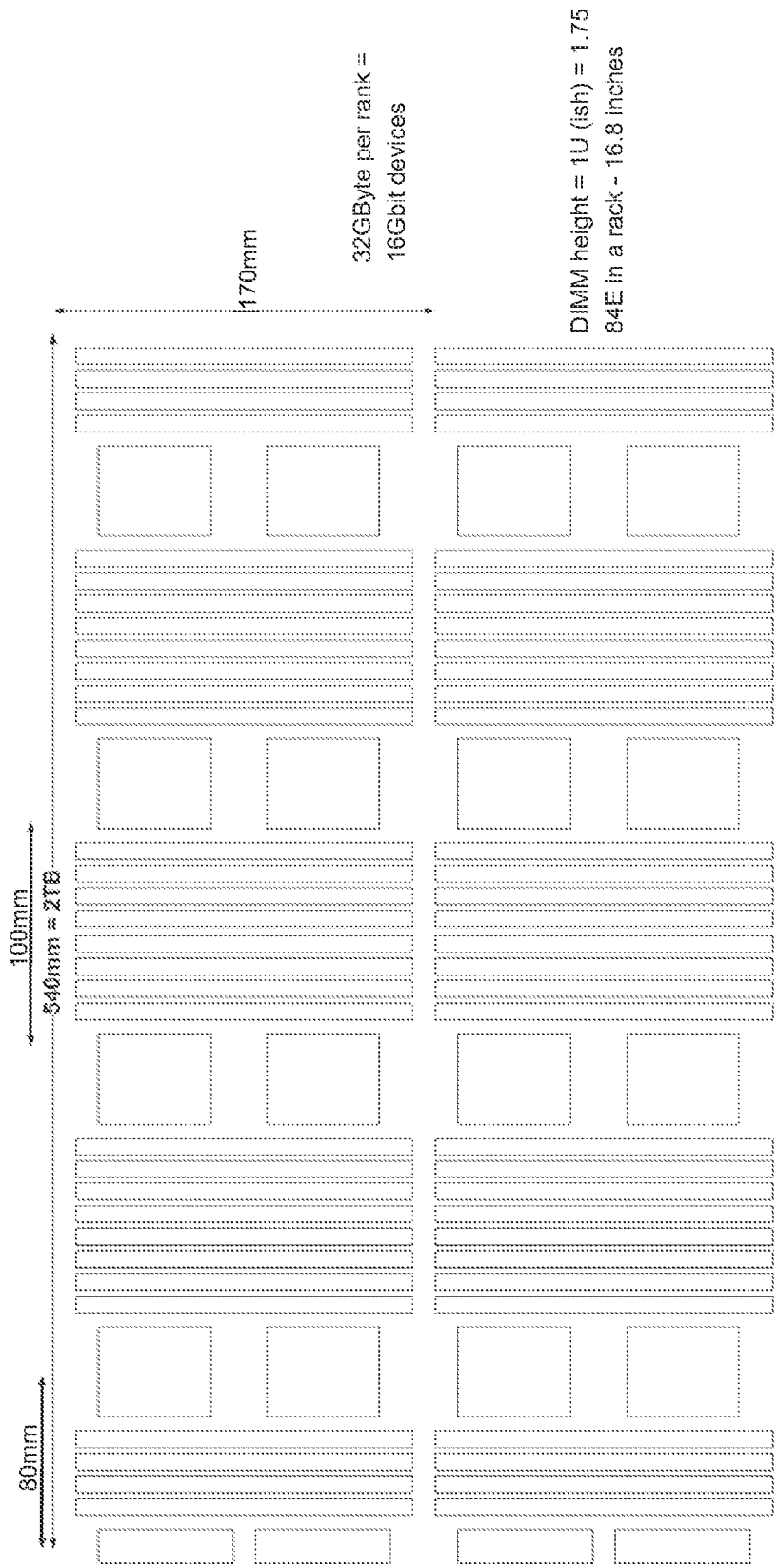
FIG. 14 is a simplified diagram illustrating implementations of memory blades with DIMMS.
Figure 15:
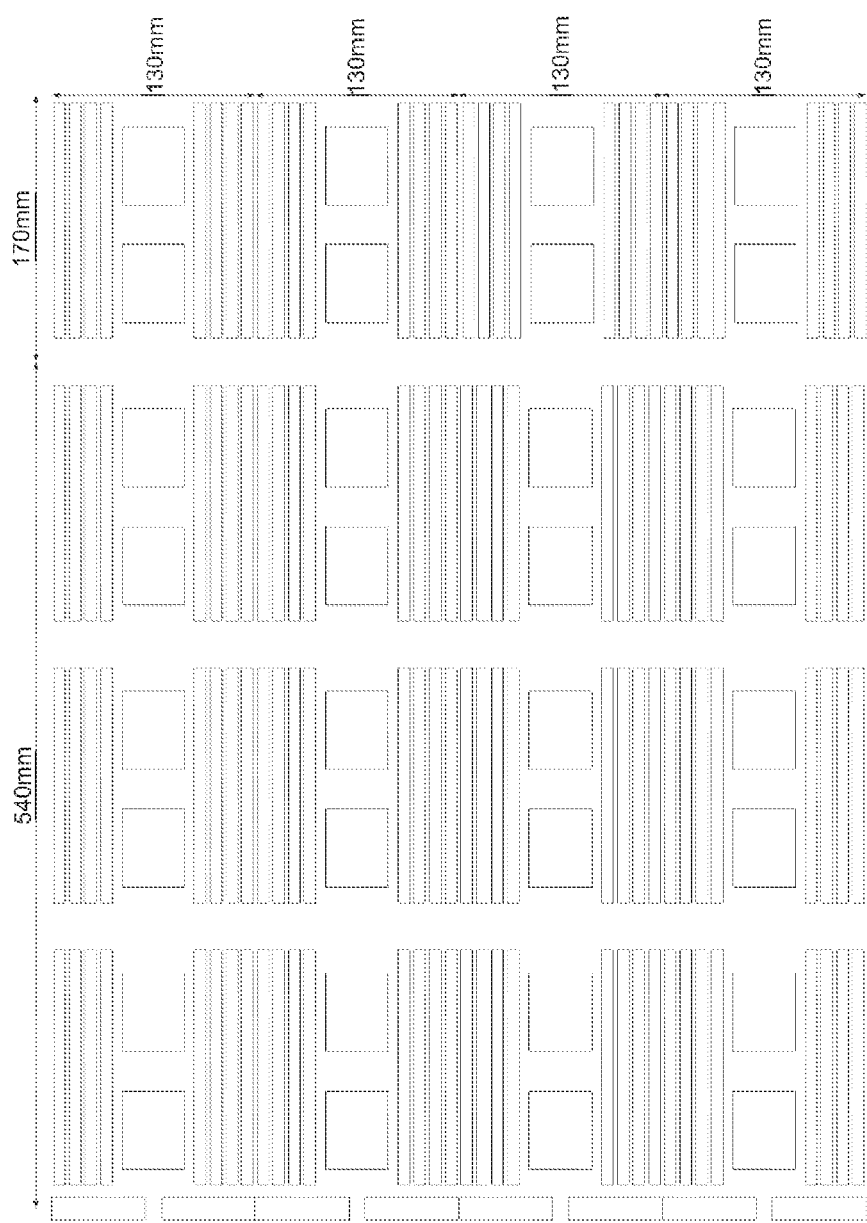
FIG. 15 is a simplified diagram illustrating implementations of memory blades with DIMMS.

FIGS. 14-15 are simplified diagrams illustrating implementations of memory blades with DIMMS. These diagrams merely provide an example, which should not unduly limit the scope of the claims. One of ordinary skill in the art would recognize many variations, alternatives, and modifications.

It is to be appreciated that embodiments of the present invention provide many advantages and can be flexibly implemented. In various embodiments, hybrid memory systems provide for non-volatile DIMMs (NVDIMM), which are like to be the next generation of DIMMs for increased capacity. Memory blades can be used to answers the storage server needs, and also facility the process that saves and restores data through power failures. IMCs can be configured to provide a feature-rich implementation of the iMB to support multiple applications (with CPU support). For example, system level mix and match can be with LRDIMMs only. For example, the 100G interconnections can provide other Memory Appliances for HPC.

The memory blades and the techniques thereof can address the memory centric computing of today. With advent of ubiquity of computer devices, data is proliferating, and CPU's have plenty of performance. To better serve the general needs, an objective is to change the paradigm of old sever and computer models. For example, servers today are often Single, Dual, Quad processor with user configures by adding some amount of DRAM memory. By using memory blade as a memory appliance, a user can purchase an appliance with his required "X" Tbytes of memory. As need, the user can then add some amount of CPU processing. An important aspect is to ensure end to end data integrity. For example, it is important that a system does not refer to bit errors. In addition, overall processing of the data needs a certain level of guarantee. If a process fails or crashes, then the data should remain and another process can start and repeat from the last known good data. However, memory latency is not a driving factor.

There are many applications for memory appliances. For example, applications includes networking switches/routers, unified compute or compute servers, storage servers, blade servers, LP servers, unified platforms, and many others.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of operating a server system, the method comprising:
in a network configured with the server system comprising:
an optical interconnect;
a top of rack switch apparatus coupled to the optical interconnect;
an enclosure having a plurality of mounting interfaces for a plurality of servers, each of the servers being coupled to the top of the rack switch apparatus;
a first blade housing structure configured with a length of no more than 900 mm and a width of no more than 500 mm, the first blade housing structure is disengageably coupled to at least one of the mounting interfaces;
a first memory controller module comprising a first processor interface, a plurality of volatile memory interface, a plurality of solid-state memory interfaces, and a plurality of cascade interfaces, the first memory controller being disengageably mounted on the first blade housing structure;
a first processor disengageably mounted to a first mounting interface of the enclosure, the processor being connected to the memory controller via the first processor interface;
a plurality of volatile memory modules disengageably mounted to a plurality of memory mounting interfaces of the first blade housing structure;
a plurality of solid-state memory modules disengageably mounted to a plurality of memory solid state interfaces of the first blade housing structure;
a power management system positioned with the enclosure;
a network interface positioned within the enclosure; and
a thermal management system positioned within the enclosure;
wherein the first processor interface is a QPI interface, HT interface, or ARM processor interface, a high speed serial interface, or a PCI-e interface; and
operating the server system.

2. The method of claim 1 further comprising a plurality of blade housings for memory blade servers, wherein the first blade structure comprises a hybrid memory blade server.

3. The method of claim 1 wherein:
the memory controller module is configured to dynamically assign addresses to the plurality of volatile memory modules;
the plurality of volatile memory modules comprises DRAM modules.

4. The method of claim 1 wherein the plurality of volatile memory modules is configured in an array.

5. The method of claim 1 further comprising a second memory controller module connected to the first memory controller module via a first cascade interface at a bandwidth of at least 10 Gbps.

6. The method of claim 1 wherein the solid-state memory interfaces comprises one or more solid-state controllers.

7. The method of claim 1 wherein the plurality of volatile memory interface comprises a serial connection.

8. The method of claim 1 wherein the plurality of volatile memory interface comprises a plurality of DDRx interfaces.

9. The method of claim 1 wherein the cascade interfaces comprises a serial interface.

10. A method of operating a server system, the method comprising:
in a network configured with the server system, the server system comprising a top of a rack switch apparatus, an optical interconnect, and an enclosure having a plurality of mounting interfaces for a plurality of servers;

a first blade housing structure configured with a length of no more than 900 mm and a width of no more than 500 mm, the first blade housing structure is disengageably coupled to at least one of the mounting interfaces;

a first memory controller module comprising a first processor interface, a plurality of volatile memory interface, a plurality of solid-state memory interfaces, and a plurality of cascade interfaces, the first memory controller being disengageably mounted on the first blade housing structure;

a first processor disengageably mounted to a first mounting interface of the enclosure, the processor being connected to the memory controller via the first processor interface;

a plurality of volatile memory modules disengageably mounted to a plurality of memory mounting interfaces of the first blade housing structure;

a plurality of solid-state memory modules disengageably mounted to a plurality of memory solid state interfaces of the first blade housing structure;

a power management system positioned with the enclosure;

a network interface positioned within the enclosure; and a thermal management system positioned within the enclosure; and operating the first memory controller to:
receive a memory allocation request;
evaluate a usage requirement associated with the memory allocation request;
select volatile memory modules and/or solid-state memory modules based on at least one the usage requirement.

11. The method of claim 10 further comprising a second memory controller module connected to the first memory controller module via a first cascade interface at a bandwidth of at least 10 Gbps.

12. The method of claim 10 wherein the solid-state memory interfaces comprises one or more solid-state controllers.

13. The method of claim 10 wherein the plurality of volatile memory interface comprises a serial connection.

14. The method of claim 10 wherein the plurality of volatile memory interface comprises a plurality of DDRx interfaces.

15. The method of claim 10 wherein the cascade interfaces comprises a serial interface.

16. A method for operating a server system, the method comprising:

in a network configured with the server system comprising:
a top of a rack switch apparatus, an optical interconnect, and an enclosure having a plurality of mounting interfaces for a plurality of servers;

a first blade housing structure configured with a length of no more than 900 mm and a width of no more than 500 mm, the first blade housing structure is disengageably coupled to at least one of the mounting interfaces;

a first memory controller module comprising a first processor interface, a plurality of volatile memory interface, a plurality of solid-state memory interfaces, and a plurality of cascade interfaces, the first memory controller being disengageably mounted on the first blade housing structure;

a first processor disengageably mounted to a first mounting interface of the enclosure, the processor being connected to the memory controller via the first processor interface;

a plurality of volatile memory modules disengageably mounted to a plurality of memory mounting interfaces of the first blade housing structure;

a plurality of solid-state memory modules disengageably mounted to a plurality of memory solid state interfaces of the first blade housing structure;

a power management system positioned with the enclosure;

a network interface positioned within the enclosure; and a thermal management system positioned within the enclosure; and operating the first memory controller to copy data stored in volatile memory modules to the solid-state memory modules in response to one or more predetermined conditions.

17. The method of claim 16 further comprising a second memory controller module connected to the first memory controller module via a first cascade interface at a bandwidth of at least 10 Gbps.

18. The method of claim 16 wherein the solid-state memory interfaces comprises one or more solid-state controllers.

19. The method of claim 16 wherein the plurality of volatile memory interface comprises a serial connection.

20. The method of claim 16 wherein the plurality of volatile memory interface comprises a plurality of DDRx interfaces, and wherein the cascade interfaces comprises a serial interface.

* * * * *